United States Patent
Lau et al.

(10) Patent No.: US 12,343,840 B2
(45) Date of Patent: Jul. 1, 2025

(54) CONTROL OF PROCESSING PARAMETERS FOR SUBSTRATE POLISHING WITH SUBSTRATE PRECESSION

(71) Applicant: Applied Materials, Inc., Santa Clara, CA (US)

(72) Inventors: Eric Lau, Santa Clara, CA (US); Charles C. Garretson, Monterey, CA (US); Huanbo Zhang, San Jose, CA (US); Zhize Zhu, Cupertino, CA (US); Benjamin Cherian, San Jose, CA (US); Brian J. Brown, Palo Alto, CA (US); Thomas H. Osterheld, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 546 days.

(21) Appl. No.: 17/681,673

(22) Filed: Feb. 25, 2022

(65) Prior Publication Data
US 2022/0283554 A1    Sep. 8, 2022

Related U.S. Application Data

(60) Provisional application No. 63/157,606, filed on Mar. 5, 2021.

(51) Int. Cl.
   *H01L 21/67*    (2006.01)
   *B24B 37/005*   (2012.01)
   (Continued)

(52) U.S. Cl.
   CPC .......... *B24B 37/005* (2013.01); *B24B 49/006* (2013.01); *B24B 49/12* (2013.01);
   (Continued)

(58) Field of Classification Search
   None
   See application file for complete search history.

(56) References Cited

U.S. PATENT DOCUMENTS

| | | | |
|---|---|---|---|
| 6,439,964 | B1 | 8/2002 | Prahbu et al. |
| 6,530,822 | B1 | 3/2003 | Lin |

(Continued)

FOREIGN PATENT DOCUMENTS

| | | |
|---|---|---|
| CN | 1554118 | 12/2004 |
| CN | 104471685 | 3/2015 |

(Continued)

OTHER PUBLICATIONS

Office Action in Japanese Appln. No. 2023-553941, dated Sep. 17, 2024, 8 pages (with English translation).

(Continued)

*Primary Examiner* — Allan W. Olsen
(74) *Attorney, Agent, or Firm* — Fish & Richardson P.C.

(57) ABSTRACT

Generating a recipe for a polishing process includes receiving a target removal profile that includes a target thickness to remove for a plurality of locations spaced angularly around a center of a substrate, storing a first function providing substrate orientation relative to the carrier head over time, storing a second function defining a polishing rate below a zone of the zone as a function of one or more pressures of one or more zones from a plurality of pressurizable zones of the carrier head that are spaced angularly around the center of the substrate, and for each particular zone of the plurality of zones, calculating a recipe defining a pressure for the particular zone over time. Calculating the recipe includes calculating an expected thickness profile after polishing from the second function defining the polishing rate and the first function providing substrate orientation relative to the zone over time, and applying a mini- (Continued)

mizing algorithm to reduce a difference between the expected thickness profile and the target thickness profile.

17 Claims, 7 Drawing Sheets

(51) Int. Cl.
*B24B 49/00* (2012.01)
*B24B 49/12* (2006.01)
*B24B 49/16* (2006.01)
*G05B 13/04* (2006.01)
(52) U.S. Cl.
CPC ............ *B24B 49/16* (2013.01); *G05B 13/041* (2013.01); *G05B 13/047* (2013.01); *H01L 21/67092* (2013.01)

(56) References Cited

U.S. PATENT DOCUMENTS

| | | | |
|---|---|---|---|
| 6,540,591 B1 | 4/2003 | Pasadyn et al. | |
| 6,544,103 B1 | 4/2003 | Korovin | |
| 6,796,877 B1 | 9/2004 | Bingham et al. | |
| 6,932,671 B1 | 8/2005 | Korovin et al. | |
| 7,115,017 B1 | 10/2006 | Laursen et al. | |
| 8,774,958 B2 | 7/2014 | Zhang et al. | |
| 9,067,295 B2 | 6/2015 | Deshpande et al. | |
| 9,213,340 B2 | 12/2015 | Zhang et al. | |
| 9,390,986 B2 | 7/2016 | Kobayashi et al. | |
| 10,493,590 B2 | 12/2019 | Zhang et al. | |
| 10,562,148 B2 | 2/2020 | Shen et al. | |
| 11,931,853 B2 * | 3/2024 | Lau .................. B24B 49/12 | |
| 2002/0146970 A1 | 10/2002 | Saldana et al. | |
| 2002/0164924 A1 | 11/2002 | Korovin | |
| 2002/0193899 A1 | 12/2002 | Shanmugasundram et al. | |
| 2002/0197745 A1 | 12/2002 | Shanmugasundram et al. | |
| 2004/0023606 A1 | 2/2004 | Wang et al. | |
| 2005/0020185 A1 | 1/2005 | Zuniga et al. | |
| 2005/0070205 A1 | 3/2005 | Korovin et al. | |
| 2006/0009127 A1 | 1/2006 | Sakurai et al. | |
| 2007/0102116 A1 | 5/2007 | Shanmugasundram et al. | |
| 2007/0224915 A1* | 9/2007 | David .................. B24B 37/013 451/6 |
| 2007/0243795 A1 | 10/2007 | Kobayashi et al. | |
| 2008/0119119 A1 | 5/2008 | Zuniga et al. | |
| 2010/0029177 A1 | 2/2010 | Kobayashi et al. | |
| 2012/0129431 A1 | 5/2012 | Hui et al. | |
| 2012/0277897 A1 | 11/2012 | Zhang et al. | |
| 2013/0065493 A1 | 3/2013 | Takahashi | |
| 2014/0017824 A1 | 1/2014 | Iizumi et al. | |
| 2014/0020829 A1 | 1/2014 | Chen et al. | |
| 2014/0273749 A1 | 9/2014 | Dhandapani et al. | |
| 2015/0099424 A1 | 4/2015 | Takahashi et al. | |
| 2015/0147829 A1 | 5/2015 | Benvegnu et al. | |
| 2015/0266159 A1 | 9/2015 | Shiokawa et al. | |
| 2015/0348797 A1 | 12/2015 | Hui et al. | |
| 2016/0074989 A1 | 3/2016 | Fukushima et al. | |
| 2016/0096251 A1 | 4/2016 | Zhang et al. | |
| 2016/0361792 A1 | 12/2016 | Nakayama et al. | |
| 2017/0216991 A1 | 8/2017 | Yamaguchi et al. | |
| 2017/0259395 A1 | 9/2017 | Kobata et al. | |
| 2018/0264619 A1 | 9/2018 | Yoshida | |
| 2019/0096722 A1 | 3/2019 | Dhandapani et al. | |
| 2019/0118333 A1 | 4/2019 | Yagi | |
| 2020/0016722 A1 | 1/2020 | Nakamura | |
| 2020/0210547 A1 | 7/2020 | Dhandapani et al. | |
| 2021/0066142 A1 | 3/2021 | Lau et al. | |
| 2022/0281053 A1 | 9/2022 | Lau et al. | |
| 2022/0281056 A1* | 9/2022 | Cherian ................ B24B 37/005 |
| 2024/0009796 A1* | 1/2024 | Cherian ................ B24B 37/005 |

FOREIGN PATENT DOCUMENTS

| | | |
|---|---|---|
| CN | 108857859 | 11/2018 |
| CN | 109844923 | 6/2019 |
| CN | 111699074 | 9/2020 |
| JP | 2002-535151 | 10/2002 |
| JP | 2006-043873 | 2/2006 |
| JP | 2008-503356 | 2/2008 |
| JP | 5357561 | 12/2015 |
| JP | 2018-133480 | 8/2018 |
| KR | 10-2015-0104523 | 9/2015 |
| KR | 10-2017-0000067 | 1/2017 |
| TW | 200607604 | 3/2006 |
| TW | 200822204 | 5/2008 |
| WO | WO 2008/032753 | 3/2008 |
| WO | WO 2014/014661 | 1/2014 |

OTHER PUBLICATIONS

Office Action in Korean Appln. No. 10-2023-7033215, dated Aug. 29, 2024, 30 pages (with English summary).
Bae et al., "Effect of Retainer Pressure on Removal Profile and Stress Distribution in Oxide CMP," International Conference on Planarization/CMP Technology, Fukuoka, Nov. 19-21, 2009, pp. 345-349.
International Search Report and Written Opinion in International Appln No. PCT/US2022/018014, dated Jun. 8, 2022, 9 pages.
Office Action in Chinese Appln. No. 202210225634.1, dated Jul. 18, 2023, 11 pages (with English translation).
Notice of Allowance in Chinese Appln. No. 202210225634.1, dated Apr. 3, 2024, 8 pages (with English translation).

* cited by examiner

CONTROL OF PROCESSING PARAMETERS FOR SUBSTRATE POLISHING WITH SUBSTRATE PRECESSION

CROSS-REFERENCE TO RELATED APPLICATIONS

This application claims priority to U.S. Provisional Application Ser. No. 63/157,606, filed on Mar. 5, 2021, the disclosure of which is incorporated by reference.

TECHNICAL FIELD

The present disclosure relates generally to control of processing parameters for chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer, e.g., until the top surface of a patterned layer is exposed or a predetermined thickness remains over the non-planar surface. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad.

One problem in CMP is selecting an appropriate polishing rate to achieve a desirable profile, e.g., a substrate layer that has been planarized to a desired flatness or thickness, or a desired amount of material has been removed. In addition, variations in the initial thickness of a substrate layer, the slurry composition, the polishing pad condition, the relative speed between the polishing pad and a substrate, and the load on a substrate can cause variations in the material removal rate across a substrate, and from substrate to substrate. These variations cause variations in the time needed to reach the polishing endpoint and the amount removed.

SUMMARY

Generating a recipe for a polishing process includes receiving a target removal profile that includes a target thickness to remove for a plurality of locations spaced angularly around a center of a substrate, storing a first function providing substrate orientation relative to the carrier head over time, storing a second function defining a polishing rate below a zone of the zone as a function of one or more pressures of one or more zones from a plurality of pressurizable zones of the carrier head that are spaced angularly around the center of the substrate, and for each particular zone of the plurality of zones, calculate a recipe defining a pressure for the particular zone over time. Calculating the recipe includes calculating an expected thickness profile after polishing from the second function defining the polishing rate and the first function providing substrate orientation relative to the zone over time, and applying a minimizing algorithm to reduce a difference between the expected thickness profile and the target thickness profile.

In another aspect, generating a recipe for controlling a polishing system includes receiving a target removal profile that includes a target thickness to remove for a plurality of locations on a substrate, storing a function defining a polishing rate below a zone of the zone as a function of one or more pressures of one or more zones from a plurality of pressurizable zones of the carrier head, and for each particular zone of the plurality of zones calculating a recipe defining a pressure for the particular zone over time. Calculating the recipe includes calculating an expected thickness profile after polishing using the function defining the polishing rate as a function of the one or more pressures of the one or more zones, and minimizing a cost function that incorporates a first term representing a difference between the expected thickness profile and the target thickness profile and a second term representing variation in pressure over time.

Implementations may include one or more of the following features. The cost function may include a factor based on a difference between an expected thickness profile provided by the polishing parameters and a target thickness removal profile. Minimization of the cost function can be represented at least in part by minimization of $$\|\Sigma_{t=0}^{T} B(t) u(t) \cdot \Delta t - R\|$$

where R is the target thickness removal profile, u[t] is a vector representing polishing parameters as a function of time, B[t] is a selector matrix that varies over time consistent with the first function, and $\Delta t$ is a time step in the summation.

Implementations can include one or more of the following potential advantages.

Polishing rates that vary angularly about the center of these substrates can be controlled more reliably, permitting reduction of angular asymmetry in polished substrates.

Understanding the substrate rotation with respect to the carrier head allows control of operating parameters, e.g., chamber pressures, that help achieve a desired (or target) thickness profile.

Operating parameters for the polisher, e.g., chamber pressures, platen rotation rate, etc., can be "optimized" for multiple objectives simultaneously, including one or more objectives other than simply minimizing a difference between an expected thickness profile and the target thickness profile. It should be understood that optimization (or "minimization") is subject to computational constraints on the algorithm such as processing power or time.

By using a stored function with operating parameters, e.g., pressure, that affect the polishing rate and that incorporates the evolution of the substrate orientation relative to the carrier head, a recipe can be generated that permits asymmetry correction due to either inherent asymmetry of the polishing process or asymmetry in thickness of the incoming substrate.

The details of one or more embodiments set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Conventional CMP systems are designed to remove material symmetrically about the axis of rotation of the carrier head. This is because with both the carrier head and the platen rotating, removal rates across the wafer would, ideally, be angularly symmetric. However, incoming wafers might have films with angularly asymmetric deposition, and the polishing process itself might result in angularly asymmetric removal. One proposal to compensate for this angular asymmetry is to provide multiple controllable zones spaced angularly around the center axis of the carrier head. These multiple zones could apply different pressures, thus counteracting the angular asymmetry.

A complication is that as polishing progresses, the substrate can rotate relative to the carrier head. This relative rotation is sometimes called "precession." If the CMP system does not take into account precession, the different pressures applied by the angularly disposed zones might not correct the asymmetry, and in fact might cause the asymmetry to become worse.

Therefore, understanding the substrate orientation relative to the carrier head, and setting a polishing rate below the zone of the carrier head based on the substrate orientation, can help correct asymmetric polishing of the substrate. A technique to correct asymmetry is to select pressure differentials over time based on the substrate orientation relative to the carrier head to reach the target thickness profile.

A polishing control model that takes into account the change in the substrate orientation relative to the carrier head over time can more reliably generate a predicted polishing profile, and thus be used to select or control polishing parameters to more reliably cause the substrate to be polished to a target profile. In particular, a Preston matrix that relates polishing parameters to the polishing rate profile can vary over time.

The algorithm of the polishing control model finds the values of the polishing parameters, e.g., pressure, over time that minimize the difference between the expected thickness profile that would result from the polishing parameters and the target thickness profile. The calculation of the expected thickness profile includes a function that provides substrate orientation relative to the carrier head over time.

The asymmetry correction technique can include generation of a recipe that includes instructions to orient the incoming substrate to a desired starting angular orientation. The desired starting angular orientation can be selected to minimize the difference between the expected thickness profile and the target thickness profile.

Figure 1:
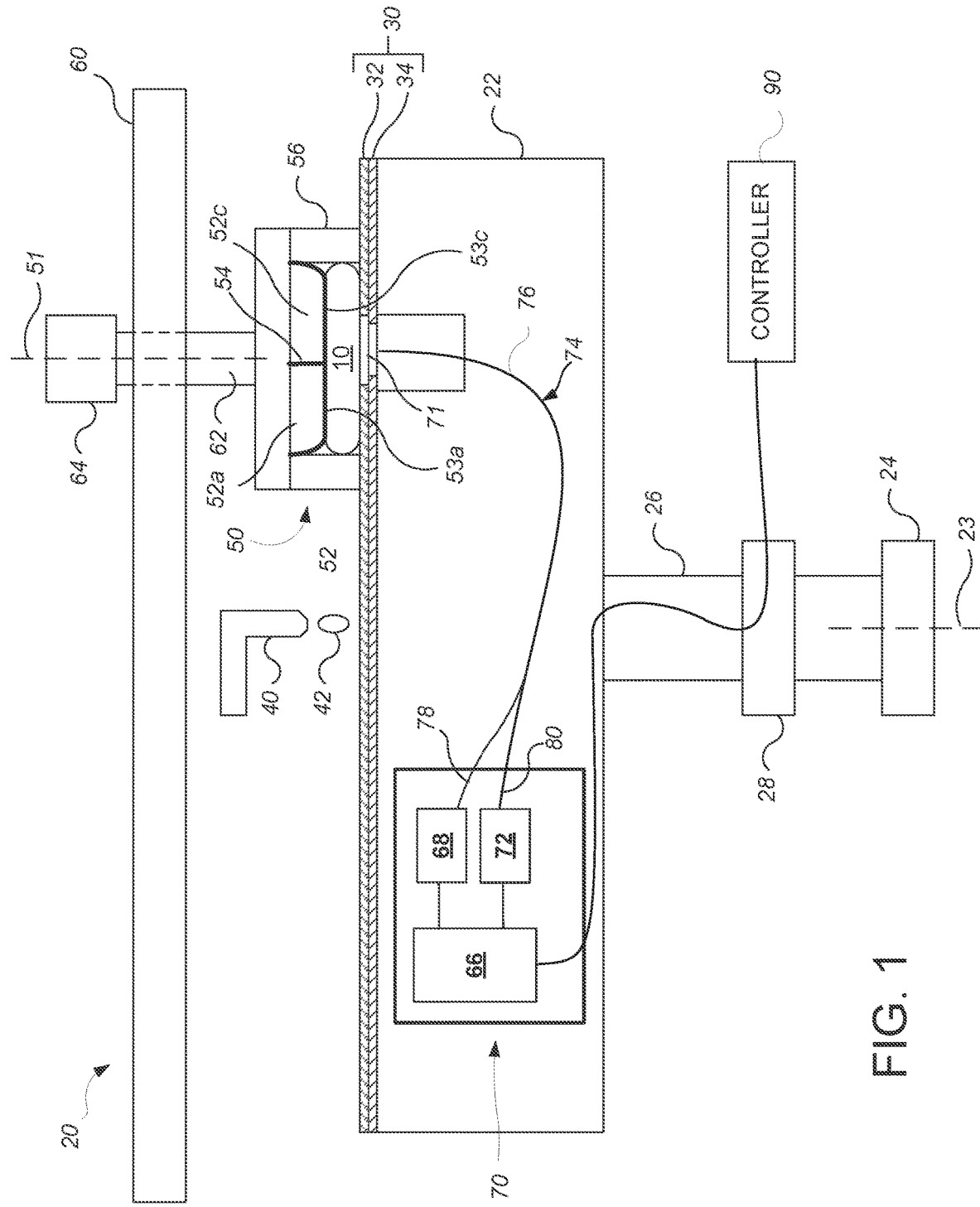
FIG. 1 illustrates a schematic cross-sectional view of an example of a polishing apparatus.

Referring to FIG. 1 illustrates an example of a polishing apparatus 20. The polishing apparatus 20 can include a rotatable disk-shaped platen 22 on which a polishing pad 30 is situated. The platen is operable to rotate about an axis 23. For example, a motor 24 can turn a drive shaft 26 to rotate the platen 22. The polishing pad 30 can be detachably secured to the platen 22, for example, by a layer of adhesive. The polishing pad 30 can be a two-layer polishing pad with an outer polishing layer 32 and a softer backing layer 34.

The polishing apparatus 20 can include a polishing liquid supply port 40 to dispense a polishing liquid 42, such as an abrasive slurry, onto the polishing pad 30. The polishing apparatus 20 can also include a polishing pad conditioning disc to abrade the polishing pad 30 to maintain the polishing pad 30 in a consistent abrasive state.

A carrier head 50 is operable to hold a substrate 10 against the polishing pad 30. The carrier head 50 can include a retaining ring 56 to retain the substrate 10 during polishing.

Figure 2:
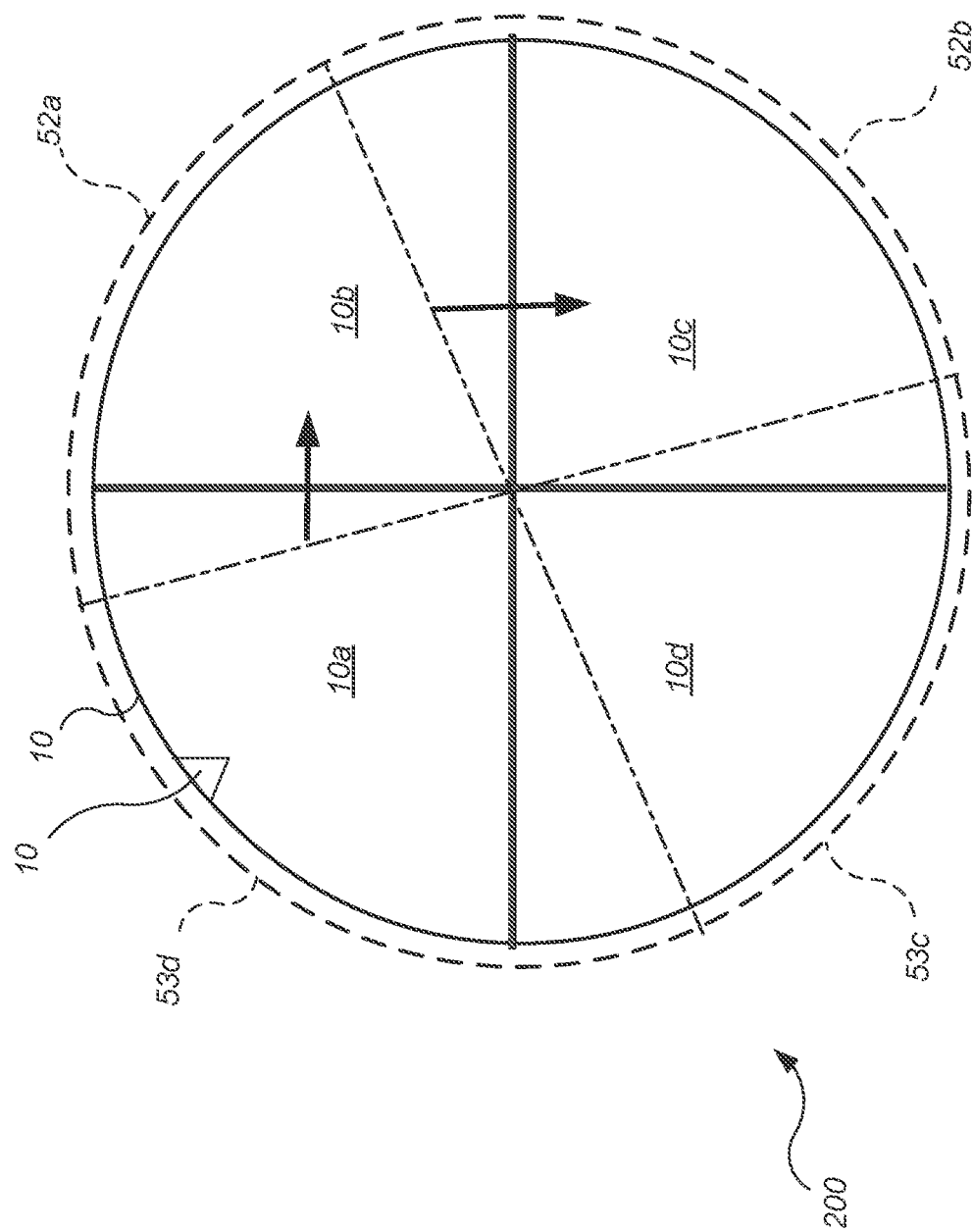
FIG. 2 illustrates a schematic top view of a movement of a carrier head relative to a substrate divided in multiple locations.

The carrier head 50 can include a plurality of independently controllable pressurized zones 53a-53d, e.g., as provided by chambers 52a-52d, which can apply independently controllable pressures to associated portions of the substrate 10 (see FIG. 2). Only two chambers 52a, 52c and the associate zones 53a, 53c are illustrated in FIG. 1 due to the cross-sectional view. However, there could be another number of zones, e.g., five or more, and the zones could be arranged in other patterns, e.g., the bottom of the carrier head could be divided into zones radially as well as angularly. FIG. 2 illustrates the zones 53a-53d as uniformly sized and evenly angularly spaced around the axis of rotation. However, this is not required.

Still referring to FIG. 2, the substrate is divided angularly into a plurality of regions 10a-10d. For ease of illustration and understanding, the zones 53a-53d are illustrated as quadrants covering different portions of the bottom of the carrier head, whereas the regions 10a-10d are similarly sized quadrants covering different portions of the substrate. Likewise, there could be another number of regions, e.g., five or more, and the regions could be arranged in other patterns, e.g., the surface of the substrate could be divided into regions radially as well as angularly.

Returning to FIG. 1, the chambers 52a-52d and resulting zones 53a-53d can be defined by a flexible membrane 54 having a bottom surface to which the substrate 10 is mounted. However, other mechanisms to adjust the pressure applied to the substrate, e.g., piezoelectric actuators, could be used in the carrier head 50.

Each carrier head 50 is suspended from a support structure 60, e.g., a carousel or track, and is connected by a drive shaft 62 to a carrier head rotation motor 64 so that the carrier head can rotate about an axis 51. Optionally each carrier head 50 can oscillate laterally, e.g., on sliders on the carousel, by motion along the track; or by rotational oscillation of the carousel itself. In operation, the platen 22 is rotated about its central axis 23, and the carrier head 50 is rotated about its central axis 51 and translated laterally across the top surface of the polishing pad 30.

The polishing apparatus can also include an in-situ monitoring system 70, which can be used to determine whether to adjust a polishing rate or an adjustment for the polishing rate as discussed below. The in-situ monitoring system 70 can include an optical monitoring system, e.g., a spectrographic monitoring system, or an eddy current monitoring system.

In one embodiment, the monitoring system 70 is an optical monitoring system. An optical access through the polishing pad is provided by including an aperture (i.e., a hole that runs through the pad) or a solid window 71. The solid window 71 can be secured to the polishing pad 30, e.g., as a plug that fills an aperture in the polishing pad, e.g., is molded to or adhesively secured to the polishing pad, although in some implementations the solid window can be supported on the platen 22 and project into an aperture in the polishing pad.

The optical monitoring system 70 can include a light source 68, a light detector 72, and circuitry 66 for sending and receiving signals between a remote controller 90, e.g., a computer, and the light source 68 and light detector 72. One or more optical fibers can be used to transmit the light from the light source 68 to the optical access in the polishing pad, and to transmit light reflected from the substrate 10 to the detector 72. For example, a bifurcated optical fiber 74 can be used to transmit the light from the light source 68 to the substrate 10 and back to the detector 72. The bifurcated optical fiber 74 can include a trunk 76 positioned in proximity to the optical access, and two branches 78 and 80 connected to the light source 68 and detector 72, respectively.

In some implementations, the top surface of the platen can include a recess into which is fit an optical head that holds one end of the trunk of the bifurcated fiber. The optical head can include a mechanism to adjust the vertical distance between the top of the trunk and the solid window.

The output of the circuitry 66 can be a digital electronic signal that passes through a rotary coupler, e.g., a slip ring, in the drive shaft 26 to the controller 90 for the optical monitoring system. Similarly, the light source can be turned on or off in response to control commands in digital electronic signals that pass from the controller 90 through the rotary coupler to the optical monitoring system 70. Alternatively, the circuitry 66 could communicate with the controller 90 by a wireless signal.

The light source 68 can be operable to emit white light. In one implementation, the white light emitted includes light having wavelengths of 200-800 nanometers. A suitable light source is a xenon lamp or a xenon mercury lamp.

The light detector 72 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency).

As noted above, the light source 68 and light detector 72 can be connected to a computing device, e.g., the controller 90, operable to control their operation and receive their signals. The computing device can include a microprocessor situated near the polishing apparatus, e.g., a programmable computer. With respect to control, the computing device can, for example, synchronize activation of the light source with the rotation of the platen 22.

In some implementations, the light source 68 and detector 72 of the in-situ monitoring system 70 are installed in and rotate with the platen 22. In this case, the motion of the platen will cause the sensor to scan across each substrate. In particular, as the platen 22 rotates, the controller 90 can cause the light source 68 to emit a series of flashes starting just before and ending just after each substrate 10 passes over the optical access. Alternatively, the computing device can cause the light source 68 to emit light continuously starting just before and ending just after each substrate 10 passes over the optical access. In either case, the signal from the detector can be used to modify control inputs at a sufficiently high frequency, e.g., every 2-20 seconds, to permit multiple adjustments over the polishing process.

In operation, the controller 90 can receive, for example, a signal that carries information describing a spectrum of the light received by the light detector for a particular flash of the light source or time frame of the detector. Thus, this spectrum is a spectrum measured in-situ during polishing.

In some implementations, the controller calculates an angular (and optionally also radial) position below the carrier head for each measurement by the in-situ monitoring system. This permits each measurement to be associated with one of the regions 10a-10d of the substrate.

The controller 90 can include a central processing unit (CPU), a memory, and support circuits, e.g., input/output circuitry, power supplies, clock circuits, cache, and the like. The memory is connected to the CPU. The memory is a non-transitory computable readable medium, and can be one or more readily available memory such as random access memory (RAM), read only memory (ROM), hard disk, or other form of digital storage. In addition, although illustrated as a single computer, the controller 90 could be a distributed system, e.g., including multiple independently operating processors and memories.

The controller 90 stores a recipe that includes polishing parameter values, e.g., pressure values, over time for each zone. For example, in operation, the controller 90 operates pressure sources coupled to the chambers 52a-52d so that the chambers 52a-52d apply the pressure over time as indicated by the recipe. In the absence of precession, pressure in different chambers could simply be held constant over the course of the polishing operation, and the pressure could be selected based on a static Preston matrix to achieve the desired polishing profile. As a result, the polishing recipe could include chamber pressures that are constant over time. However, this technique is not satisfactory if the substrate is subject to precession.

As noted above, while polishing, the substrate is subject to precession in the carrier head so the substrate orientation (relative to the carrier head) changes over time. Consequently, the portion of the substrate to which a particular zone applies pressure will change over time. For example, as illustrated in FIG. 2, if the zone 52a initially applies pressure to region 10a on the substrate, after sufficient precession (shown by the arrows), the zone 52a can eventually apply pressure to region 10b, etc. If the CMP system does not take into account these changes in substrate orientation, the different pressures applied by the angularly disposed zones might not correct the existing angular asymmetry of the substrate. Therefore, the material removal may also be asymmetric and undesired. In order to better control the polishing process and to achieve a target wafer profile, a model that takes into account the changing orientation of the substrate is described.

A technique to generate a polishing recipe that takes into account precession includes finding pressure values over time that optimize a function that include a target removal profile, a substrate orientation relative to a carrier head, and an estimated polishing rate as a function of one or more polishing parameters, e.g., pressures, for a plurality of zones below the carrier head.

Figure 3:
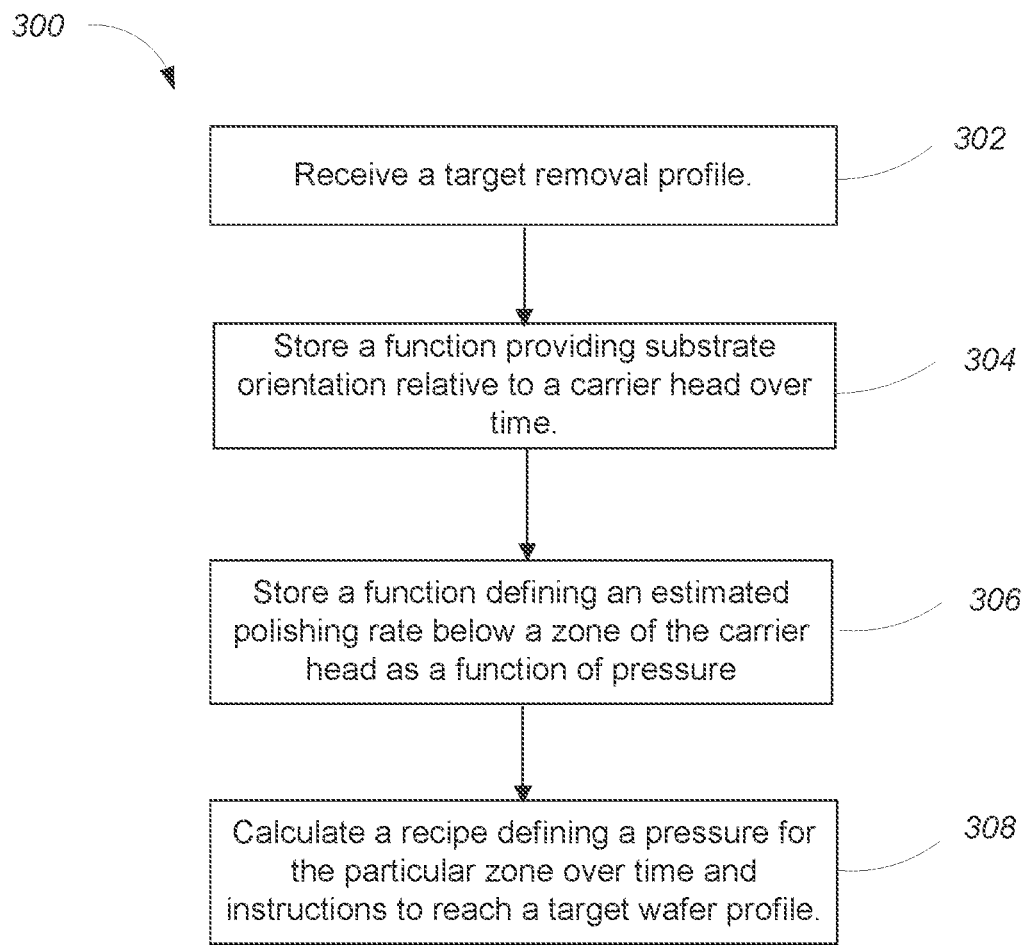
FIG. 3 is a flow diagram of a method of generating a polishing recipe that includes a polishing parameter, e.g., pressure, that varies over time.
Figure 4A:
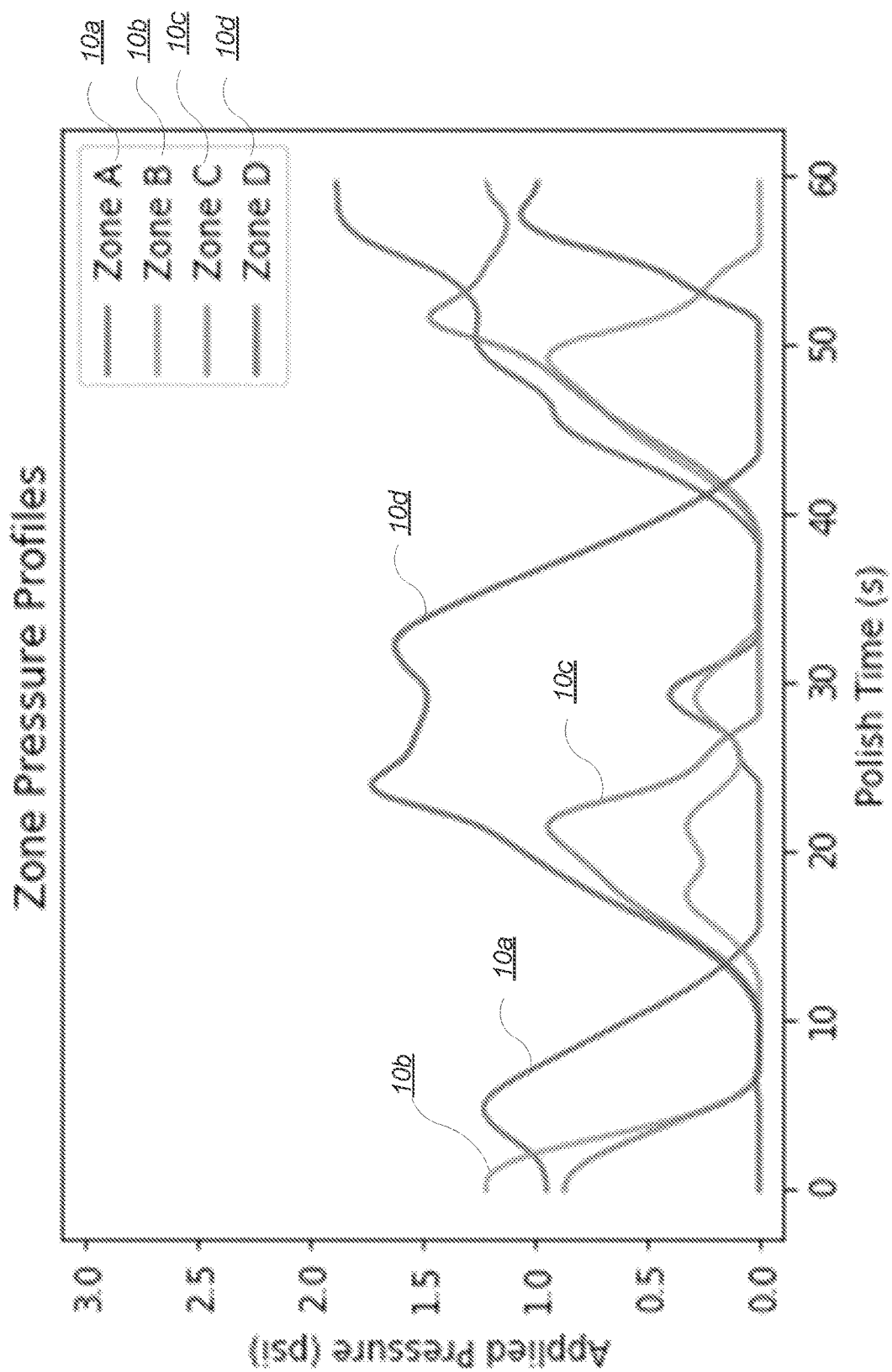
FIG. 4A illustrates an example of a distribution chart showing different pressure profiles for different zones of the carrier head.
Figure 4B:
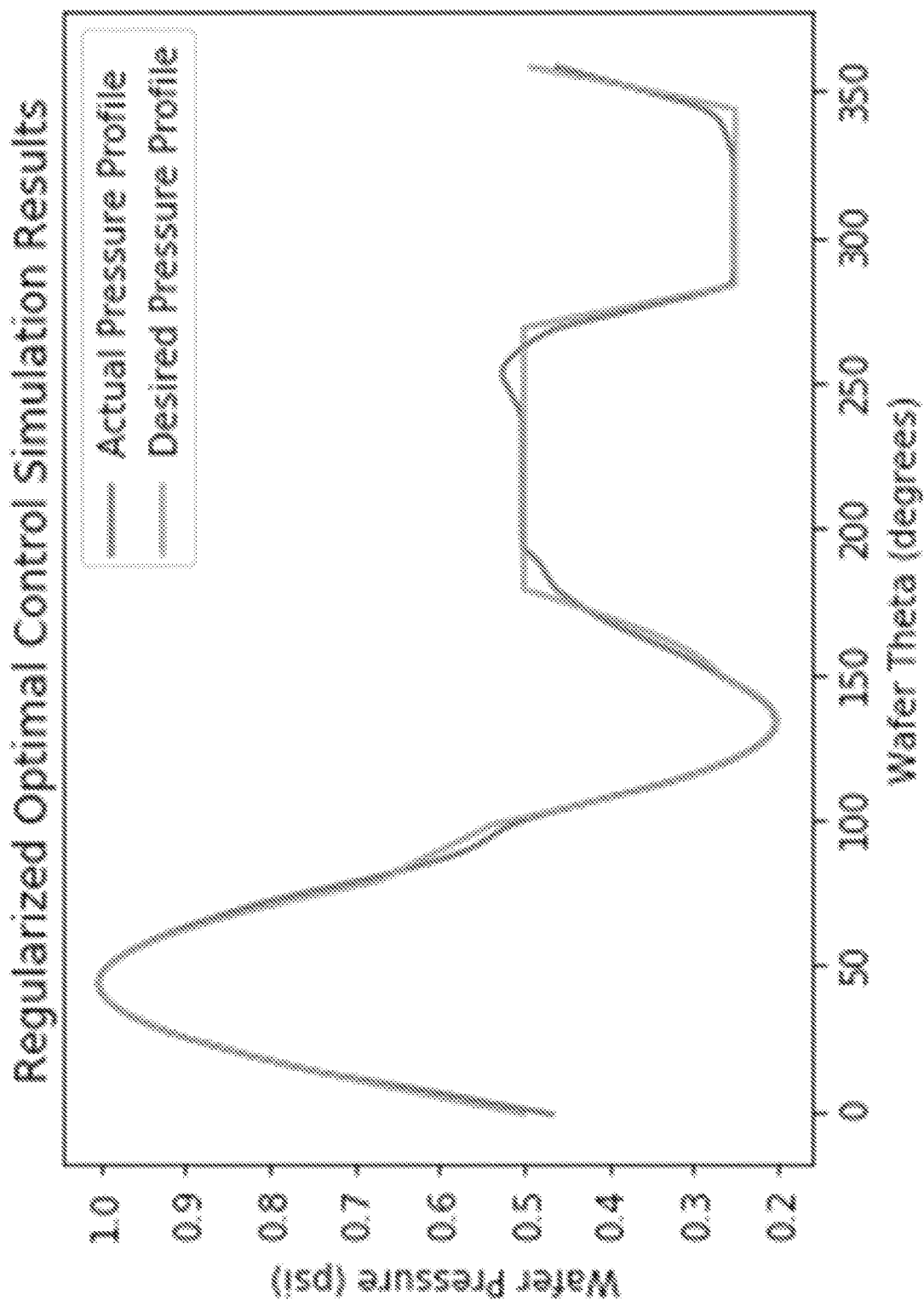
FIG. 4B illustrates an example of a distribution chart showing the relationship between an expected and a target pressure profiles.

Referring to FIG. 3, an example process 300 is shown, in connection with the example data shown in FIGS. 4A-4B. Initially, a computer, e.g., the controller, receives a target angular removal profile (e.g., target thickness to remove for a plurality of locations spaced angularly around a center of a substrate) (302).

The computer stores a function providing substrate orientation relative to a carrier head over time (304) and another function defining an estimated polishing rate for each zone of the carrier head as a function of one or more polishing parameters, e.g., pressures (306). Based on the target angular removal profile, the computer calculates a recipe for removal with a defined pressure for each particular zone over time (308). The recipe is calculated using an algorithm that calculates an expected thickness profile resulting from polishing based on the function defining a polishing rate and the function providing substrate orientation relative to the carrier head over time. In particular, the algorithm performs a minimization procedure with the pressure values over time as the variable to be adjusted to minimize the difference between the expected thickness profile and the target thickness profile.

The recipe is generated by first defining a cost function. The cost function uses a time-based relationship between the pressure applied to the chambers (and thus the zones) and the pressure applied to the regions of the substrate. For example, if x (t) is a vector representing pressure applied in various locations (regions) on the substrate and u(t) is a vector representing pressure output by each zone of the carrier head, then the vectors u and x are related by $$x[t]=B[t]*u[t]$$

where B[t] represents a selector matrix that takes in consideration the angular position of the substrate with respect to the carrier head as a function of time (t).

More specifically, the relationship between the pressure applied to the chambers and the pressure applied to the regions of the substrate equation can be given by $$p(\theta,r,t)=B(\theta,r,t)u(\theta,r,t,P)$$

where $B(\theta,r,t)$ is a selector matrix indicating relating the position (in the reference frame of the carrier head) at which pressure is being applied to the location on the substrate (i.e., in the reference frame of the substrate) to which the pressure is applied at any given point in time. $\rho(\theta,r,t)$ is the pressure seen by the substrate at a location position given by an angular position $\theta$ and radial position r and time t.

In some implementations, the cost function includes the difference between the expected thickness profile and the target thickness profile. That is, the cost function can be represented as $$J = \frac{1}{T}\int_0^T \rho(\theta, r, t)dt - \frac{1}{T}*R(\theta, r)$$

where T is the total polishing time and $R(\theta,r)$ is the desired removal profile.

Minimization of the above cost function can be converted into a problem of minimizing the following:

$$\|\Sigma_{t=0}^T B(t)u(t)\Delta t - R\|$$

where $\Delta t$ is the time difference between steps in the summation, and u(t) are the process parameters to be adjusted during the minimization process, e.g., the pressures as a function of time t. The expression inside the double-bar notation is a vector where each element of the vector is a location on the substrate and the value of the element is the difference between the desired removal and actual removal at that location over the course of polishing the substrate. The double-bar notation indicates taking a 2-norm of the vector, thus effectively summing over (squared) removal error across all of the substrate.

By solving the described optimization problem, the polishing parameter as a function of time, e.g., pressures as a function of time, can be generated, thus providing the recipe.

A potential problem with the above approach is that it can result in a "bang-bang" pressure control, in which pressures rapidly oscillate between minimum and maximum pressures.

In some implementations, the optimization problem is further regularized by including a factor in the cost function that takes into consideration rapidly changing pressures. For example, the rapidly changing pressures can be represented by addition of a term to the cost function that depends on the difference between pressures applied at consecutive times. The weight of this term relative to the effect of the difference between the estimated thickness profile and desired thickness provide can be provided by a lambda term ($\lambda$).

In particular, in some implementations, the cost function can be represented by minimization of the following:

$$\left\|\sum_{t=0}^T B(t)u(t)\Delta t - R\right\| + \lambda \sum_{t=\Delta t}^T \|u(t) - u(t - \Delta t)\|$$

The value for lambda ($\lambda$) can be determined empirically. For example, lambda ($\lambda$) can be about 0.01 to 0.1.

Again, u(t) are the process parameters to be adjusted during the minimization process, e.g., the pressures as a function of time t. And solving the optimization problem generates the polishing parameters as a function of time, e.g., pressures as a function of time, thus providing the recipe.

FIG. 4A illustrates an example of a distribution chart showing results of varying pressures across different locations 10a-10d on a substrate 10. The results are generated using the described model.

In some implementations, polishing parameters can be calculated in real time during processing in response to in-situ measurements. As a simple solution, the current profile of the substrate can be measured based on measurements from the in-situ monitoring system. The difference between the current thickness profile and the desired profile provides a revised thickness removal profile R. The cost function can then be minimized at regular intervals given the most recent measured thickness profile, thus providing a new polishing recipe to be executing going forward in the polishing process.

However, another technique for accomplishing a desired thickness profile with correction of angular asymmetry in real time based on in-situ measurements is to use a cost function which takes into consideration constraints of state evolution. For example, the state evolution can be expressed as:

$$x[t+1]=A*x[t]+B[t]*u[t]$$

$$x[t]=C[t]*y[t]$$

where u(t) are the polishing parameters, e.g., pressures, as a function of time, x(t) are the state parameters, e.g., thickness, as a function of time, and y[t] are sensor measurements. The matrix A accounts for changes in substrate orientation during removal if there is no change in pressures, B[t] is a Preston matrix that changes over time based on the function relating substrate orientation to time, and C[t] provides mapping of individual measurements from the zone on the carrier head to the location on the substrate.

The controller can minimize a total cost function using a linear quadratic regulator (LQR) approach. The aggressiveness of the controller is defined by A, B[t] and C[t].

Figure 5A:
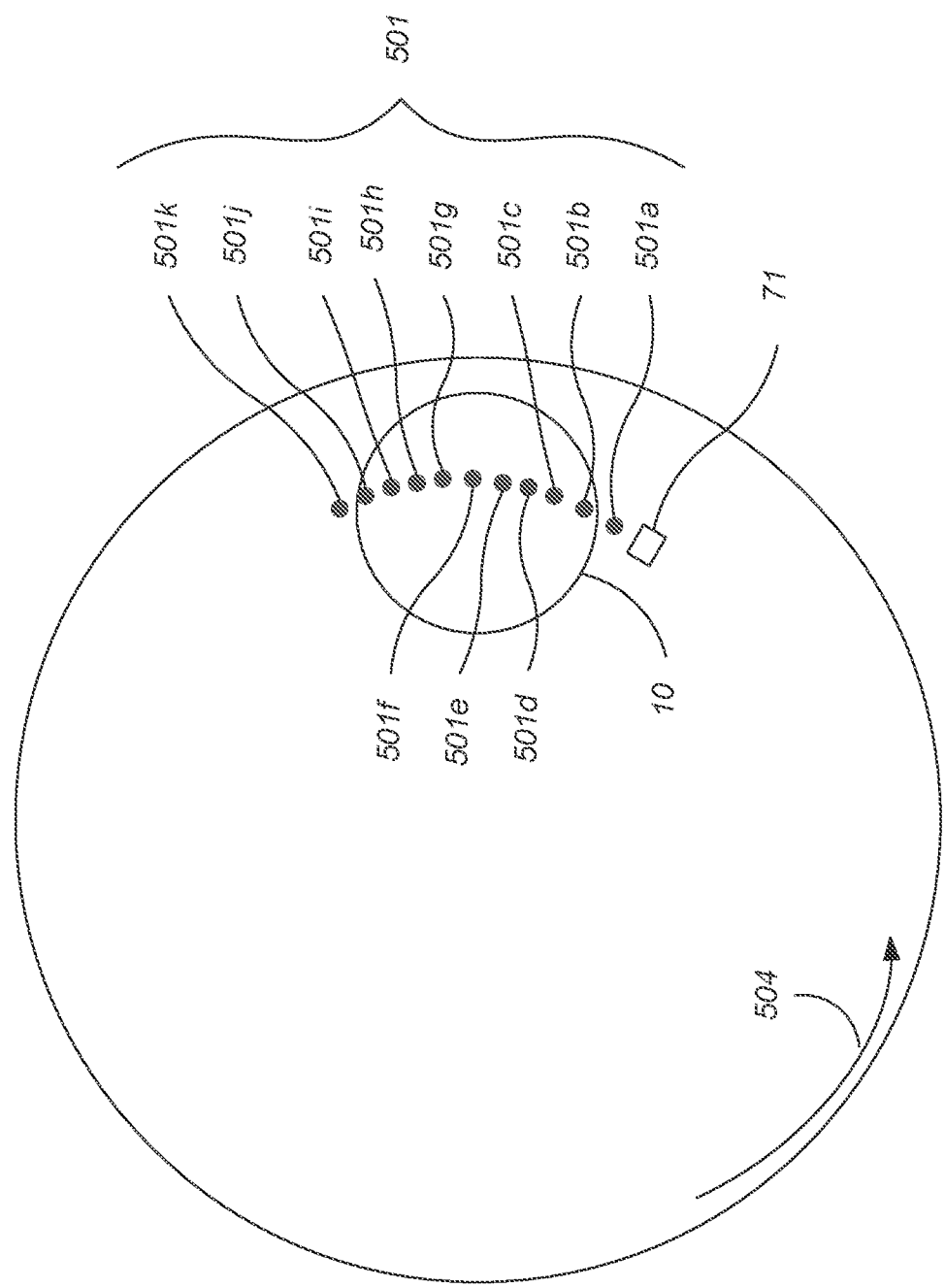
FIG. 5A illustrates a top view of a polishing pad and shows regions where in-situ measurements are taken on a substrate.

As shown in FIG. 5A, if the detector is installed in the platen, due to the rotation of the platen (shown by arrow 504), as the window 71 travels below one carrier head (e.g., the carrier head holding the substrate 10), the in-situ monitoring system making pressure measurements at a sampling frequency will cause the pressure measurements to be taken at locations 501 in an arc that traverses the substrate 10. For example, each of points 501a-501k represents a location of a pressure measurement by the monitoring system of the substrate 10 (the number of points is illustrative; more or fewer measurements can be taken than illustrated, depending on the sampling frequency). As shown, over one rotation of the platen, pressures are obtained from different radii on the substrate 10. That is, some pressures are obtained from locations closer to the center of the substrate 10 and some are closer to the edge. Thus, for any given scan of the in-situ monitoring system across a substrate 10 based on timing, motor encoder information, and optical detection of the edge of the substrate and/or retaining ring, the controller 90 can calculate the radial position (relative to the center of the substrate 10) for each measured pressure from the scan. The polishing system can also include a rotary position sensor, e.g., a flange attached to an edge of the platen that will pass through a stationary optical interrupter, to provide additional data for determination of the position on the substrate of the measured pressure. The controller 90 can thus associate the various measured pressures with the locations 10a-10d (see FIG. 2) on the substrate 10. In some implementations, the time of measurement of the pressure can be used as a substitute for the exact calculation of the radial position.

Figure 5B:
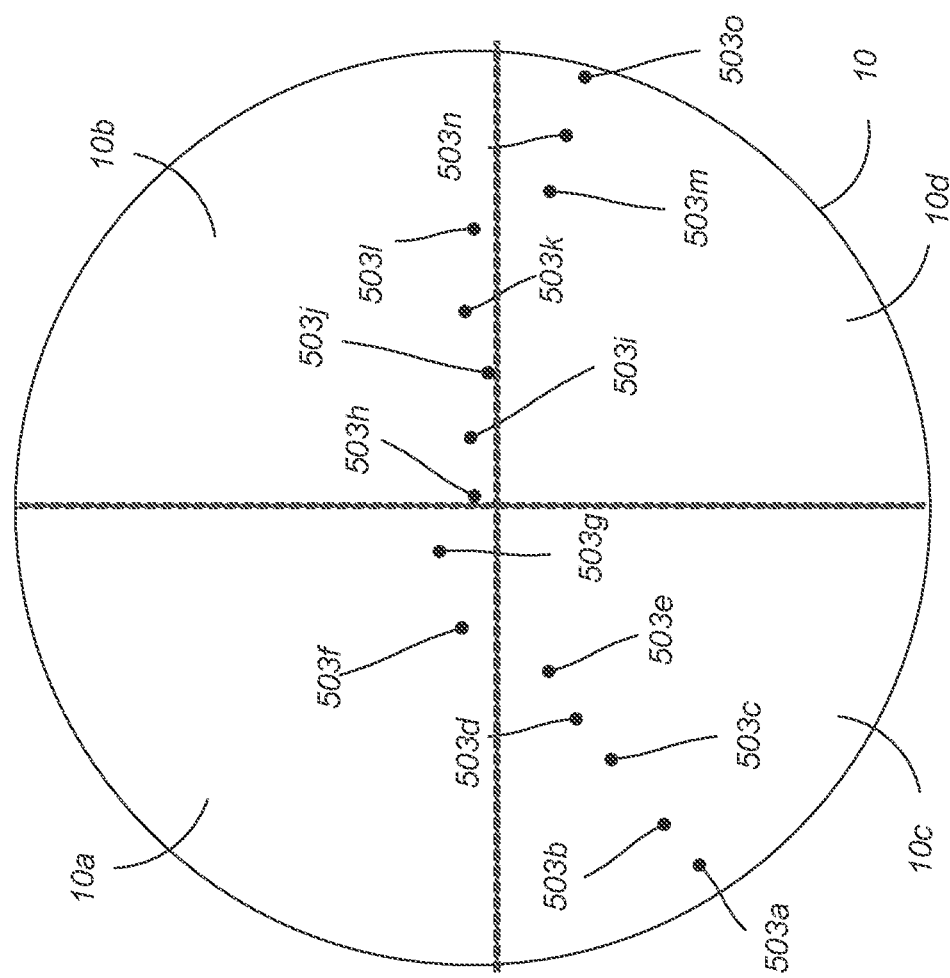
FIG. 5B illustrates a schematic top view of a distribution of multiple locations where in-situ measurements are taken relative to multiple locations of a substrate.

As an example, referring to FIG. 5B, in one rotation of the platen, pressure corresponding to different regions 503a-503o are collected by the light detector 72. Based on the radial positions of the regions 503a-503o, five pressures collected at regions 503a-503b and 503m-503o are associated with the outer locations 10c and 10d, respectively; five spectra collected at regions 503k-503l are associated with location 10b; and five spectra collected at regions 503f-503g are associated with the location 10a. Although this example shows that each location is associated with the same number of pressure measurements, the locations may also be associated with different numbers of pressure based on the in-situ measurements. The number of pressures associated with each location may change from one rotation of the platen to another. Of course, the numbers of regions given above are simply illustrative, as the actual number of pressure associated with each location will depend at least on the sampling rate, the rotation rate of the platen, and the radial width of each location.

Without being limited to any particular theory, the measurements reflected from the substrate 10 evolve as polishing progresses (e.g., over multiple rotations of the platen, not during a single sweep across the substrate) due to changes in the thickness of the outermost layer, thus yielding a sequence of time-varying measurements.

For each measured pressure, the controller 90 can calculate a characterizing value. These characterizing values then provide y[t]. The characterizing value is typically the thickness of the outer layer, but can be a related characteristic such as thickness removed. In addition, the characterizing value can be a physical property other than thickness, e.g., conductivity. In addition, the characterizing value can be a more generic representation of the progress of the substrate through the polishing process, e.g., an index value representing the time or number of platen rotations at which the pressure would be expected to be observed in a polishing process that follows a predetermined progress.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on control of a chemical mechanical polishing system, the in-sequence metrology station can be applicable to other types of substrate processing systems, e.g., etching or deposition systems.

Embodiments, such as the filtering processes, of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. Alternatively or in addition, the program instructions can be encoded on an artificially generated propagated signal, e.g., a computer-generated electrical, optical, or electromagnetic signal, that is generated to encode information for transmission to suitable receiver apparatus for execution by a data processing apparatus. The computer storage medium can be a computer-readable storage device, a computer-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems and processes described in this specification, or portions of them, can be implemented in a computer program product that includes instructions that are stored on one or more non-transitory computer-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

Other embodiments are within the scope of the following claims.

What is claimed is:

1. A computer program product for generating a recipe for controlling a polishing system, the computer program product encoded on a non-transitory computer readable medium and comprising instructions for causing one or more computers to:
   receive a target thickness profile that includes a target thickness for a plurality of locations spaced angularly around a center of a substrate;
   store a first function providing substrate orientation relative to a carrier head over time;
   store a second function defining a polishing rate below a pressurizable zone from a plurality of pressurizable zones of the carrier head as a function of one or more pressures of one or more zones from the plurality of pressurizable zones of the carrier head, the plurality of pressurizable zones spaced angularly around an axis of rotation of the carrier head;

for each particular zone of the plurality of zones, calculate a recipe defining a pressure for the particular zone over time, wherein the instructions to calculate the recipe include instructions to calculate an expected thickness profile after polishing from the second function defining the polishing rate and the first function providing substrate orientation relative to the zone over time, and instructions to apply a minimizing algorithm to reduce a difference between the expected thickness profile and the target thickness profile; and cause the carrier head to apply, for each pressurizable zone of the plurality of zones, the pressure over time as defined by the recipe.

2. The computer program product of claim 1, wherein the first function maps physical zones of the head to locations on the substrate.

3. The computer program product of claim 1, wherein the first function assumes a constant precession rate of the substrate relative to the carrier head.

4. The computer program product of claim 3, wherein the first function includes calculating angular offset based on an initial angular offset and the precession rate.

5. The computer program product of claim 4, wherein the first function includes calculating the precession rate based on a carrier head rotation rate.

6. The computer program product of claim 1, wherein the second function comprises a matrix based on the Preston equation.

7. The computer program product of claim 1, wherein calculating the recipe includes minimizing a cost function that incorporates the first function and the second function.

8. The computer program product of claim 7, wherein the cost function is consistent with $x[t]=B[t]*u[t]$, wherein $x[t]$ is a vector representing pressures on the substrate as a function of time, $u[t]$ is a vector representing polishing parameters as a function of time, and $B[t]$ is a selector matrix that varies over time consistent with the first function.

9. The computer program product of claim 8, wherein $B[t]$ depends on an angular position of a region on the substrate with respect to a zone on the carrier head as a function of time (t).

10. The computer program product of claim 7, wherein the cost function is subject to evolution constraint of $x[t+1]=A*x[t]+B[t]*u[t]$.

11. The computer program product of claim 10, wherein A is a matrix that transforms coordinate positions based on rotation of substrate orientation relative to the carrier head over time.

12. The computer program product of claim 7, wherein the cost function is subject to the constraint $x[t]=C[t]*y[t]$, where $y[t]$ represent measurements over time from an in-situ monitoring system.

13. The computer program product of claim 12, wherein $C[t]$ represents a matrix that provides mapping of individual measurements from a zone on the carrier head to a location on the substrate.

14. A polishing system, comprising:
a platen to support a polishing pad;
a carrier head to hold a substrate against the polishing pad, the carrier head including a plurality of pressurizable chambers spaced angularly around an axis of rotation of the carrier head; and
a controller configured to
receive a target removal profile that includes a target thickness to remove for a plurality of locations spaced angularly around a center of a substrate,
store a first function providing substrate orientation relative to the carrier head over time,
store a second function defining a polishing rate as a function of one or more pressures of one or more zones from a plurality of pressurizable zones of the carrier head, the plurality of pressurizable zones spaced angularly around an axis of rotation,
for each particular zone of the plurality of zones, calculate a recipe defining a pressure for the particular zone over time by calculating an expected thickness profile after polishing from the second function defining the polishing rate and the first function providing substrate orientation relative to the zone over time, and applying a minimizing algorithm to reduce a difference between the expected thickness profile and the target thickness, and
cause each respective chamber of the plurality of pressurizable chambers to apply the pressure in accordance with the recipe.

15. The system of claim 14, wherein the first function assumes a constant precession rate of the substrate relative to the carrier head.

16. The system of claim 15, wherein the first function includes calculating angular offset based on an initial angular offset and a precession rate.

17. The system of claim 16, wherein the first function includes calculating the precession rate based on a carrier head rotation rate.

* * * * *